United States Patent [19]

Wojciechowski

[11] Patent Number: 5,841,703
[45] Date of Patent: Nov. 24, 1998

[54] METHOD AND APPARATUS FOR REMOVAL OF VT DROP IN THE OUTPUT DIODE OF CHARGE PUMPS

[75] Inventor: Kenneth E. Wojciechowski, Rancho Cordova, Calif.

[73] Assignee: Intel Corporation, Santa Clara, Calif.

[21] Appl. No.: 777,899

[22] Filed: Dec. 31, 1996

[51] Int. Cl.[6] .................................................. H03K 5/153
[52] U.S. Cl. .............................. 365/189.09; 365/189.11; 327/306; 327/534; 327/536
[58] Field of Search ......................... 365/189.09, 189.11; 327/390, 534, 535, 536, 537, 538, 589, 306

[56] References Cited

U.S. PATENT DOCUMENTS

| | | | |
|---|---|---|---|
| 5,216,588 | 6/1993 | Bajwa et al. | 327/536 |
| 5,313,429 | 5/1994 | Chevallier et al. | 365/226 |
| 5,414,669 | 5/1995 | Tedrow et al. | 365/226 |
| 5,422,590 | 6/1995 | Coffman et al. | 365/189.09 |
| 5,432,469 | 7/1995 | Tedrow et al. | 327/534 |
| 5,436,587 | 7/1995 | Cernea | 327/536 |
| 5,442,586 | 8/1995 | Javanifard et al. | 365/189.09 |
| 5,455,794 | 10/1995 | Javanifard et al. | 365/185.17 |
| 5,483,486 | 1/1996 | Javanifard et al. | 365/185.17 |
| 5,489,870 | 2/1996 | Arakawa | 327/534 |
| 5,495,453 | 2/1996 | Wociechowski et al. | 365/185.18 |
| 5,553,030 | 9/1996 | Tedrow et al. | 365/226 |
| 5,594,360 | 1/1997 | Wojciechowski | 365/185.18 |
| 5,596,532 | 1/1997 | Cernea et al. | 365/185.18 |
| 5,644,534 | 7/1997 | Soejima | 365/189.09 |
| 5,663,918 | 9/1997 | Javanifard et al. | 365/189.09 |
| 5,671,179 | 9/1997 | Javanifard | 365/185.33 |

*Primary Examiner*—Vu A. Le
*Attorney, Agent, or Firm*—Blakely, Sokoloff, Taylor & Zafman

[57] ABSTRACT

A charge pump having an output diode with a zero voltage drop. The present charge pump may be a multiple stage charge pump that may operate more efficiently than prior charge pumps by substantially removing the voltage drop across the output diode. The last stage in the charge pump receives a second input clock signal. The output diode includes a switch device coupled to a bootstrapping circuit which receives a third input clock signal and a fourth input clock signal. The third input clock signal and the fourth input clock signal are either non-overlapping high clock signals or non-overlapping low clock signals. A specified relationship between the second clock signal and the third clock signal, and a specified relationship between the third clock signal and the fourth clock signal are required to allow the bootstrapping circuit to properly augment the voltage passed through the switch device in the output diode.

25 Claims, 10 Drawing Sheets

METHOD AND APPARATUS FOR REMOVAL OF VT DROP IN THE OUTPUT DIODE OF CHARGE PUMPS

FIELD OF THE INVENTION

The present invention relates to the field to semiconductor integrated circuits, and more particularly to the field of charge pumps.

BACKGROUND OF THE INVENTION

The internal circuitry within a semiconductor integrated circuit ("IC") may require an internal voltage signal higher than that provided by the external power supply. For example, currently available flash memory devices may operate with a 3.3 volt or 5.0 volts power supply, but may require an internal voltage signal of 12 volts to program the flash memory cells. Typically, positive charge pump circuits are used to increase or boost the power supply voltage signal to the desired voltage level. In the example above, a charge pump may be used to raise the 5.0 volt power supply signal to a 12 volt internal voltage signal for programming flash memory cells. This may require the charge pump to boost the 5.0 volt power supply signal by 7 volts.

In certain situations, it may be desirable to use a smaller power supply. For instance, a smaller power supply may be used to reduce the power and to increase the performance of a semiconductor IC. Unfortunately, when a smaller power supply signal is used, the positive charge pump may be required to boost the power supply voltage signal by a greater voltage potential. This often requires a more efficient charge pump. If the power supply for a flash memory device provides a 1.8 volt power supply signal and the flash memory cells requires 12 volt for programming, then the positive charge pump must be able to efficiently raise the 1.8 volt power supply signal to 12 volts. In other words, the positive charge pump may be required to boost the 1.8 volt power supply signal by approximately 10.2 volts.

FIG. 1 illustrates a prior art positive charge pump 100 with multiple stages. The number of stages is dependent on the input voltage $V_{in}$ at the input 101 and the desired output voltage $V_{out}$ at the output 102. Each stage in the charge pump 100 may include a diode coupled to a capacitor. The capacitor in each stage is typically responsible for coupling charge onto the output of its stage and the diode in each stage typically ensures that its output voltage of its stage is passed to the immediately succeeding stage or to the output diode.

According to FIG. 1, the first stage may include the diode 110 and the capacitor 111; the second stage may include the diode 120 and the capacitor 121; the last stage may include the diode 180 and the capacitor 181; and the second to the last stage may include the diode 170 and the capacitor 171. It is important to note that the odd stages (e.g., first, third, fifth, etc.) typically receive a first input clock signal referred to as the clock 1 signal and the odd stages (e.g., second, fourth, sixth, etc.) typically receive a second input clock signal referred to as the clock 2 signal.

The output diode 190 may be an n-channel metal oxide silicon field effect transistor ("MOSFET") having its gate terminal coupled to its drain terminal. Typically, when a diode passes a positive voltage, its output voltage signal is equal to its input voltage signal minus its threshold voltage $V_t$. For example, if the voltage at the node 190a is 11 volts and the threshold voltage $V_t$ is 2.0 volts, then the output voltage $V_{out}$ is 9.0 volts. If the voltage drop of 2.0 volts is eliminated, then the positive charge pump outputs a higher voltage signal (e.g., 11 volts) rather than 9.0 volts.

Under certain circumstances, the internal circuitry within a semiconductor IC may require a more negative internal voltage signal than that provided by an external power supply or ground. As previously mentioned, currently available flash memory devices may operate with a 3.3 volt or 5.0 volts power supply, but may require an internal negative voltage signal (e.g., −11 volts) to erase the flash memory cells. Typically, negative charge pump circuits are used to provide the desired negative voltage signal. Thus, in the example above, a negative charge pump may be used to decrease the ground voltage signal or the negative power supply signal to provide the negative internal voltage signal for erasing the flash memory cells.

FIG. 2 illustrates a prior art negative charge pump 200. The negative charge pump 200 may include multiple stages. Unlike the positive charge pump 100 which has current flowing from the input 101 to the output 102 of the positive charge pump 100, the negative charge pump 200 typically has current flowing from the output 202 to the input 201. The capacitor in each stage may couple charge onto the input of its stage and the diode in each stage may ensure that the charge is passed to the immediately preceding stage. Thus, the output voltage $V_{out}$ is pulled more negative by each stage.

According to FIG. 2, the first stage may include the diode 210 and the capacitor 211; the second stage may include the diode 220 and the capacitor 221; the last stage may include the diode 280 and the capacitor 281; and the second to the last stage may include the diode 270 and the capacitor 271. It is important to note that the odd stages (e.g., first, third, fifth, etc.) typically receive a first input clock signal referred to as the clock 1 signal and the odd stages (e.g., second, fourth, sixth, etc.) typically receive a second input clock signal referred to as the clock 2 signal.

The output diode 290 may include a p-channel MOS transistor having its gate terminal coupled to its source terminal. According to FIG. 2, the input of the output diode 290 may be coupled to the output 202 and the output of the output diode 290 may be coupled to the node 290a. Typically, when passing a negative voltage across a diode, the output voltage signal is reduced by the threshold voltage $V_t$ of the diode. The threshold voltage $V_t$ is often referred to as the voltage drop $V_t$ across the diode.

For example, if the voltage at the input of the output diode 290 is at −13 volts and the voltage drop $V_t$ across the diode is 2.0 volts, then −11 volts is outputted by the output diode 290 at the node 202. In other words, the negative charge pump 200 may be required to provide a negative voltage at the node 290a of −13 volts in order for the charge pump 200 to output −11 volts. On the other hand, if the voltage drop $V_t$ across the diode 290 is eliminated, the negative charge pump 200 may only be required to provide a negative voltage at the node 290a of −11 volts in order for the charge pump 200 to output the same negative voltage of −11 volts.

SUMMARY OF THE INVENTION

One desire of the present invention is to reduce the voltage drop across the output diode in a charge pump.

Another desire is to provide a charge pump that can operate at a lower frequency while providing the same output voltage as the prior charge pump.

Another desire is to reduce the power consumption of the charge pump.

A charge pump is described. The charge pump includes a first stage, a second stage, and an output diode. The first stage is configured to receive a first clock signal. The second stage is coupled to the first stage and is configured to receive a second clock signal. The output diode is coupled to the second stage and includes a first switch circuit and a first bootstrapping circuit. The first bootstrapping circuit is configured to receive a first and a second non-overlapping clock signals.

A method is also described of substantially removing the voltage drop across the output diode in a charge pump. The method includes the step of providing a power supply voltage signal having a first voltage level. The power supply voltage signal is either charged or discharged to a second voltage level in response to a first clock signal. The power supply voltage signal is either charged or discharged to a third voltage level in response to a second clock signal. The charge pump outputs the power supply voltage signal at the third voltage level in response to the second clock signal, a first non-overlapping clock signal, and a second non-overlapping clock signal.

Other desires, features, and advantages of the present invention will be apparent from the accompanying drawings and from the detailed description that follows below.

BRIEF DESCRIPTION OF THE DRAWINGS

The present invention is illustrated by way of example and not by way of limitation in the figures of the accompanying drawings, in which like references indicate similar elements and in which.

DETAILED DESCRIPTION

The positive charge pump of one embodiment of the present invention may be used in any semiconductor integrated circuit ("IC") that requires an internal voltage signal having a more positive voltage level than the external power supply voltage signal. Furthermore, the negative charge pump of one embodiment of the present invention may be used in any semiconductor IC that requires an internal voltage signal having a more negative voltage level than the external power supply voltage signal or ground. By removing the voltage drop $V_t$ across the output diode of one embodiment of the charge pumps, the charge pumps operate more efficiently to generate the same voltage level as the prior charge pumps.

For example, the relationship between the output voltage of one embodiment of the charge pump, $V_{out1}$, and the output voltage of the prior art charge pump, $V_{out2}$, may be represented by the equation $V_{out1} = V_{out2} + V_t$, where $V_t$ is the threshold voltage of the output diode of the charge pumps. The voltage efficiency $V_{EFF}$ may be represented by the equation $$V_{EFF} = \frac{Vout}{nVin},$$

where n is the number of stages in the charge pump and $V_{in}$ is the power supply voltage signal. As such, the voltage efficiency $V_{EFF1}$ of one embodiment of the charge pump may be equal to $$V_{EFF2} + \frac{Vt}{nVin},$$

where $V_{EFF2}$ is equal to the voltage efficiency of the prior art charge pump. Accordingly, improvements in the efficiency of one embodiment of the charge pump becomes more apparent as the external power supply voltage signal approaches the voltage drop $V_t$ of the output diode.

Many memory devices require various internal voltage signals to perform various operations. For example, flash memory devices may require a 12 volt internal voltage signal to program the flash memory cells and may require a −11 volt internal voltage signal to erase the flash memory cells. Currently available flash memory devices may operate with a 3.3 volt or a 5.0 volt external power supply. As the demand for faster, smaller, and lower powered devices continues, flash memory devices may operate with smaller external power supplies, such as a 2.0 volt external power supply.

Figure 3:
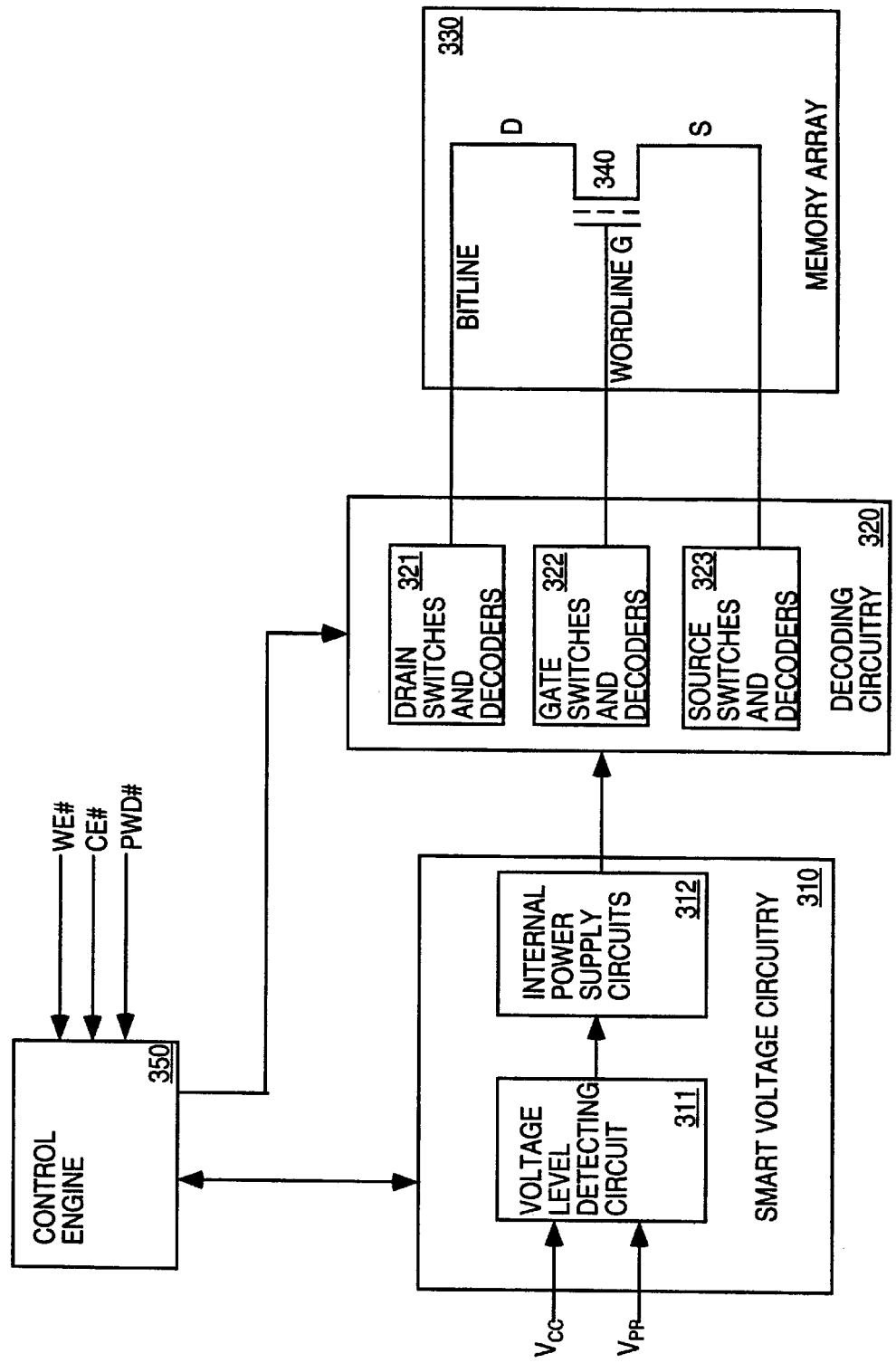
FIG. 3 illustrates one embodiment of a memory device that incorporates the present charge pump.
Figure 4:
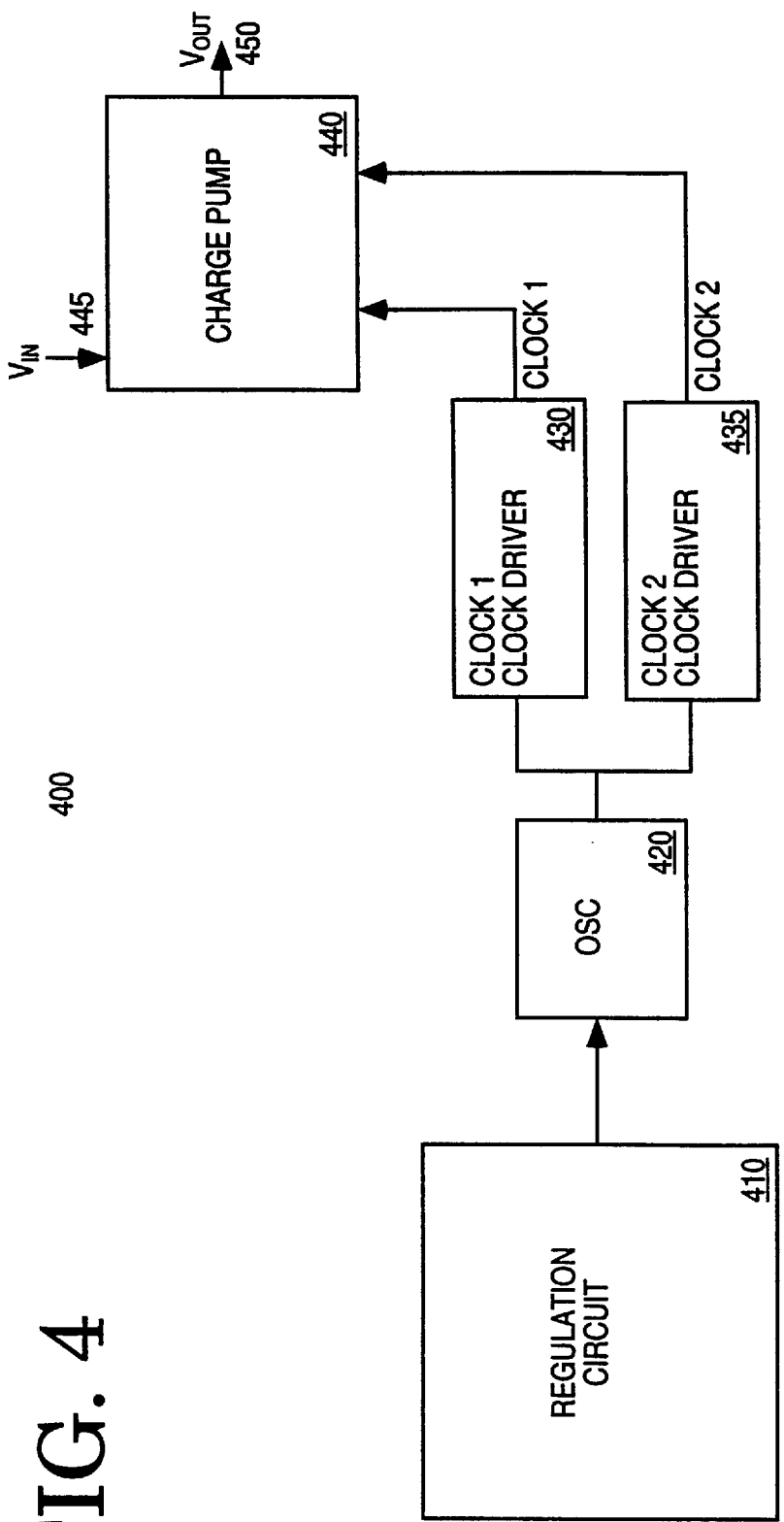
FIG. 4 illustrates one embodiment of an internal power supply circuit.

FIG. 3 illustrates one embodiment of a memory device that may incorporate one embodiment of the charge pumps. Although the memory device 300 illustrates a flash memory device, one embodiment of the charge pumps may be used in other types of volatile and non-volatile memory devices. Furthermore, one embodiment of the charge pumps may be used in semiconductor ICs other than memory devices.

The flash memory device 300 may be a flash electrically erasable read only memory ("EEPROM") device that may be formed on a single semiconductor substrate. The flash memory device 300 includes a memory array 330 having a plurality of flash memory cells 340. The flash memory cells 340 are typically floating gate transistor devices having a select gate terminal, a floating gate, a drain terminal, and a source terminal. The flash memory cells 340 are typically arranged in a matrix of rows and columns such that a common wordline is coupled to the select gate terminal of each flash memory cell of a row, and a common bitline is coupled to the drain terminal of each flash memory cell of a column.

For one embodiment, programming may be accomplished by applying 12 volts to the gate terminal, 6.0 volts to the drain terminal, and grounding the source terminal. By applying these voltages to the flash memory cells 340 selected for programming, electrons are typically placed on the floating gate by hot electron injection. On the other hand, erasing may be accomplished by applying 5.0 volts to the source terminal, −9.0 volts to the gate terminal, and allowing the drain terminal to float. During an erase operation, electrons are typically removed from the floating gate of the selected flash memory cells via electron tunneling.

The appropriate voltage levels are applied to the terminals of the flash memory cells 340 via the decoding circuitry 320. The decoding circuitry 320 includes the drain switches and decoders 321, the gate switches and decoders 322, and the source switches and decoders 323. The smart voltage circuitry 310 may be coupled to the external power supplies to receive the VCC power supply signal and the VPP programming signal. The smart voltage circuitry 310 is typically responsible for providing the required voltages to the decoding circuitry 320 under the control of the control engine 350. The control signals WE#, CE#, and PWD# are used by the control engine 330 to select the operating mode of the flash memory device 300.

For one embodiment, the smart voltage circuitry 310 may include a voltage level detecting circuit 311 coupled to an internal power supply circuit 312. The voltage level detecting circuit 311 typically detects the type of power supply (e.g., a 3.3 volt power supply, 5.0 volt power supply, etc.). The internal power supply circuit 312 typically receives the power supply voltage signal and generates the various internal voltage signals required for the various operating modes. One embodiment of the charge pumps may be located within the internal power supply circuits 312.

The memory device 300 may be a flash memory device that can be used in various types of computer systems or data processing systems. The computer system within which the flash memory device 400 is used can be a personal computer, a notebook computer, a laptop computer, a personal assistant/communicator, a minicomputer, a workstation, a mainframe, a multiprocessor computer, or any other type of computer system. In addition, the system in which the flash memory device 400 is used can be a printer system, a cellular phone system, a digital answering system, a digital camera, or any other data storage system.

For one embodiment, the internal power supply circuits 312 may include one or more of the internal power supply circuits 400. The internal power supply circuit 400 may include the charge pump 440 having an input 445 and an output 450. The charge pump 440 may receive the input clock signals clock 1 and clock 2 from the clock driver circuits 430 and 435, respectively. The regulation circuit 410 may provide a regulation signal to the oscillator 420 and may determine the amplitude of the input clock signals clock 1 and clock 2. The oscillator 420 determines the frequency of the input clock signals clock 1 and clock 2.

Figure 5:
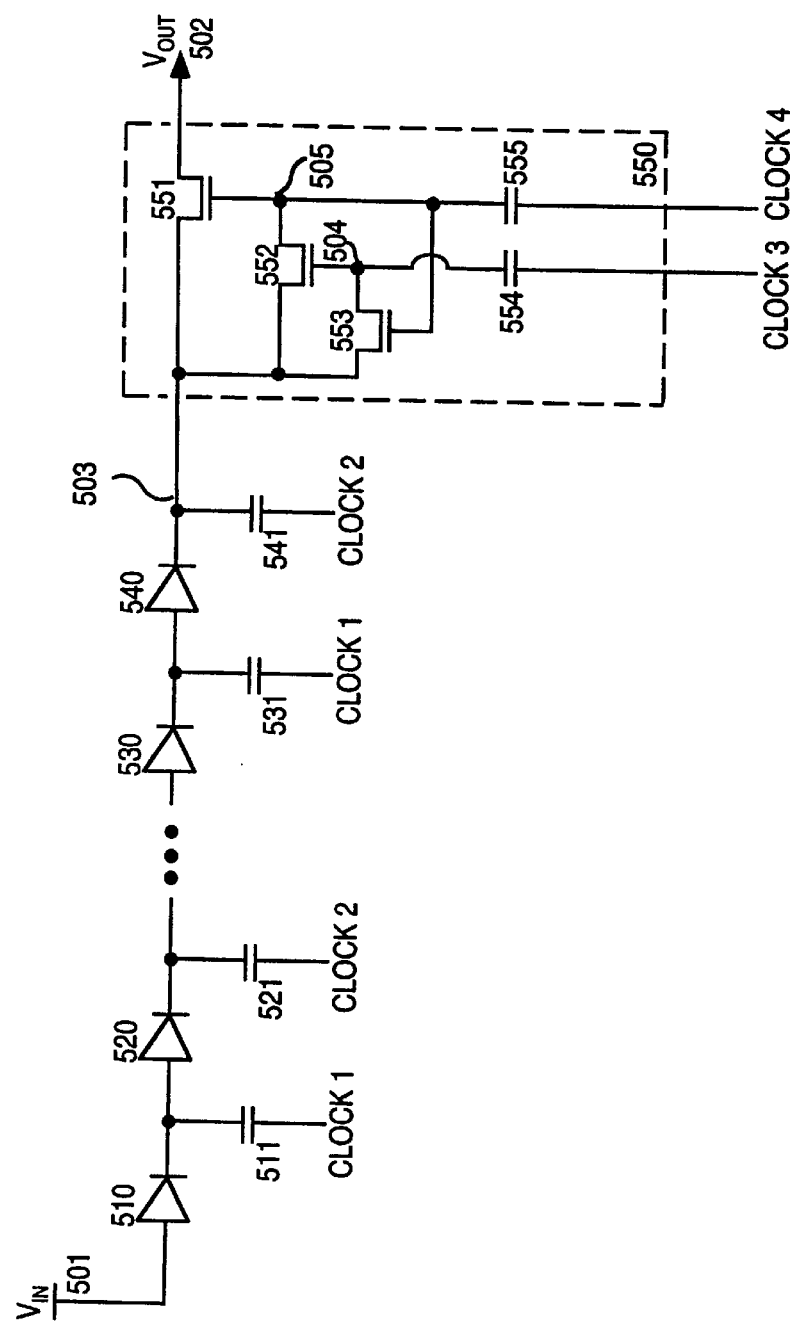
FIG. 5 illustrates one embodiment of a positive charge pump.

For one embodiment, the charge pump 440 may be implemented with the circuit shown in FIG. 5. FIG. 5 illustrates a positive charge pump. The input 501 of the charge pump 500 receives an input voltage signal $V_{in}$ and the output 502 of the charge pump 500 provides an output voltage signal $V_{out}$. Typically, the input 501 is coupled to an external power supply.

The positive charge pump 500 may include multiple stages with each stage having a diode coupled to a capacitor. According to FIG. 5, the first stage may include the diode 510 and the capacitor 511; the second stage may include the diode 520 and the capacitor 521; the last stage may include the diode 540 and the capacitor 541; and the second to the last stage may include the diode 530 and the capacitor 531. The capacitors 511 and 531 are coupled to the input clock signal clock 1 and the capacitors 521 and 541 are coupled to the input clock signal clock 2.

Unlike the output diode in the prior positive charge pump 100, the voltage drop across the output diode 550 may be entirely or substantially removed. The output diode 550 may include a switch circuit 551 coupled to a bootstrapping circuit. The bootstrapping circuit is typically used to augment the voltage passed from the input 503 of the output diode 550 to the output 502 of the output diode 550. For one embodiment, the bootstrapping circuit may include the switch devices 552 and 553, and the capacitor devices 554 and 555. According to FIG. 5, the switching devices 551, 552, and 553 may be n-channel MOS transistors. The bootstrapping circuit receives a pair of non-overlapping input clock signals clock 3 and clock 4. For one embodiment, the clock signals clock 3 and clock 4 are non-overlapping high clock signals (i.e., do not have overlapping logic high voltage levels).

Figure 7:
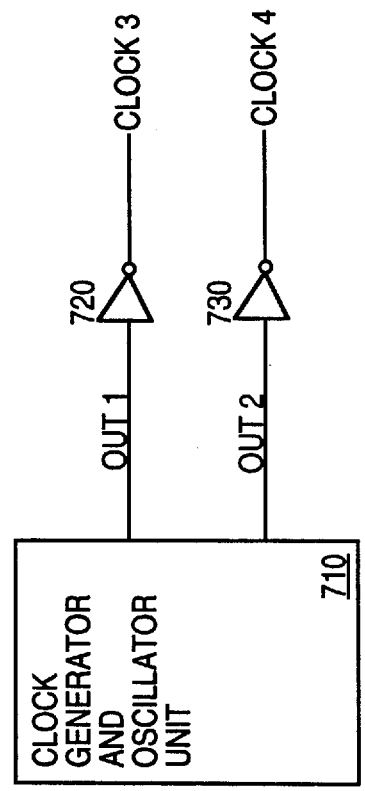
FIG. 7 illustrates one embodiment of the clock generating circuit for the clock 3 signal and the clock 4 signal.

The clock 3 signal and the clock 4 signal may be generated by the clock generator and oscillator circuit 710 shown in FIG. 7. The two output signals out1 and out2 generated by the clock generator and oscillator circuit 710 may be received by the clock driver circuits 720 and 730, respectively. The clock driver circuits may provide the non-overlapping high clock signals 720 and 730 to the bootstrapping circuit.

Figure 1:
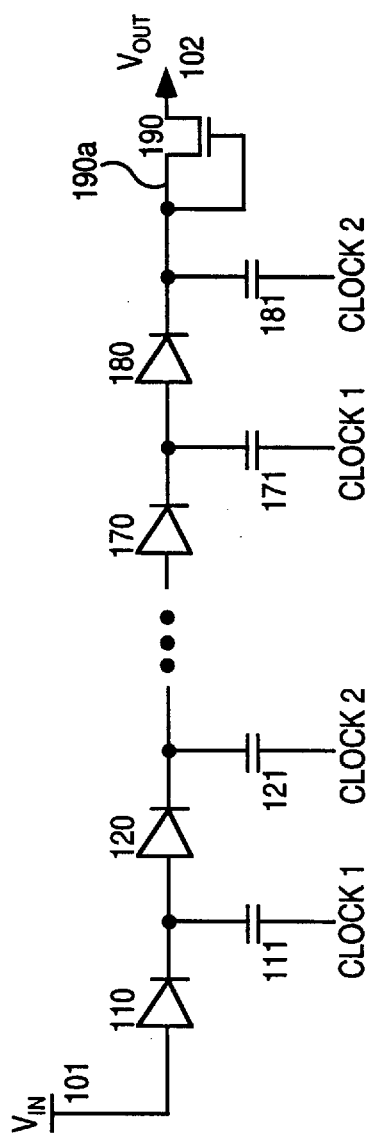
FIG. 1 illustrates a typical positive charge pump.

Referring back to FIG. 1, assume that the voltage drop of the output diode 190 is approximately 2.0 volts. For one embodiment, during a programming operation, the flash memory cells may require 12 volts for programming. Thus, the prior art positive charge pump 100 may be required to charge up the 2.0 volt external power supply signal to 14 volts in order to compensate for the 2.0 volt voltage drop $V_t$ across the output diode 190. On the other hand, one embodiment of the positive charge pump 500 reduces the $V_t$ across the output diode 550 to approximately 0 volts and therefore, one embodiment of the positive charge pump 500 may only be required to charge the 2.0 volt external power supply signal to 12 volts.

In other words, the prior positive charge pump 100 may be required to charge up the external power supply signal by 12 volts, as compared to one embodiment of the positive charge pump 500 which may be required to charge the external power supply signal by 10 volts to get the same output voltage $V_{out}$ (i.e., 12 volts). By decreasing the amount of charge that needs to be coupled onto the input voltage $V_{in}$ to produce the same output voltage $V_{out}$, one embodiment of the charge pump 500 may operate more efficiently than the prior art charge pump 100. For an alternative embodiment, the diodes 510, 520, 530, and 540 may include a switch circuit coupled to a bootstrapping circuit.

Figure 6:
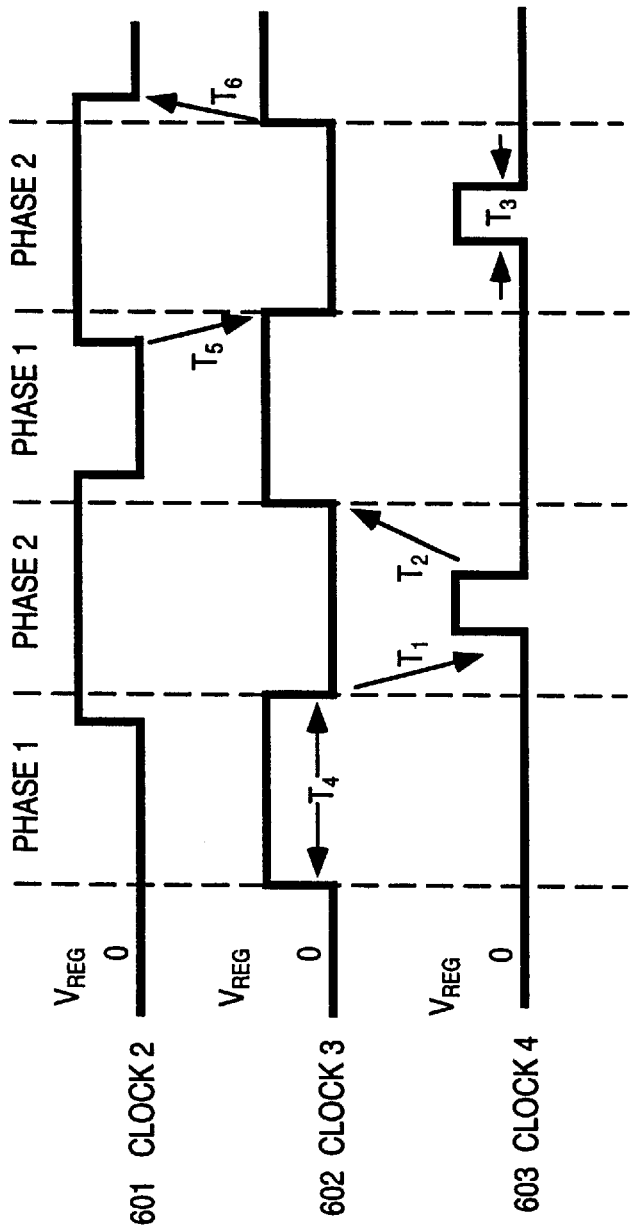
FIG. 6 illustrates the clocking waveforms for one embodiment of a positive charge pump.

For one embodiment, the relationship between the input clock signal clock 2 and the non-overlapping input clock signals clock 3 and clock 4 are illustrated in FIG. 6. According to FIG. 6, the waveform 601 may represent the input clock signal clock 2; the waveform 602 may represent the non-overlapping high input clock signal clock 3; and the waveform 603 may represent the non-overlapping high input clock signal clock 4. For one embodiment, the logic low voltage level of the clock 2, clock 3, and clock 4 signals are referred to as 0 volts and the logic high voltage level of the clock 2, clock 3, and clock 4 signals are referred to as $V_{reg}$.

According to FIG. 6, phase 1 may occur when the clock 3 signal is at a logic high voltage level and phase 2 may occur when the clock 3 signal is a logic low voltage level. The relationship between the clock 3 signal and the clock 4 signal may be characterized as follows. During phase 2, the clock 3 signal transitions to the logic low voltage level a duration of T1 before the clock 4 signal transitions to the logic high voltage level. Furthermore, during phase 2, the clock 4 signal transitions to the logic low voltage level a duration T2 before the clock 3 signal transitions to the logic high voltage level.

Typically, the durations T1 and T2 are equal. For one embodiment, the duration T1 and T2 must be long enough to turn off the transistors 553 and 551 before the transistor 552 is turned on. Furthermore, the transistor 552 must be turned off before the transistors 553 and 551 are turned on. This relationship may prevent back conduction which may degrade the operation of the output diode 550.

The relationship between the clock 2 signal and the clock 3 signal is characterized by T5 and T6. The clock 2 signal transitions to the logic high voltage level a duration of T5 before the clock 3 signal transitions to the logic low voltage level. Furthermore, the clock 3 signal transitions to the logic high voltage level before the clock 2 signal transitions to the logic low voltage level. This relationship between the clock 2 signal and the clock 3 signal may prevent back conduction if the voltage at the input of the diode 550 is not constant.

As mentioned above, for one embodiment, the clock 3 and clock 4 signals are non-overlapping high clock signals. In other words, the clock 3 signal and the clock 4 signal are not simultaneously at the logic high voltage level. According to FIG. 6, the clock 3 signal has a logic high voltage level for a duration T4 and clock 4 signal has logic high voltage level for a duration T3. For one embodiment, the duration T3 must be long enough for the transistor 553 to charge the capacitor 554 to the voltage at the node 505, $V_{505}$, minus the threshold voltage of the transistor 553, $V_{t553}$, when $V_{505}$ is less than the voltage at the node 503, $V_{503}$, plus $V_{t553}$ (i.e., $V_{505} < V_{503} + V_{t553}$). Furthermore, during the steady state, the duration T3 must be long enough for the transistor 553 to charge the capacitor 554 to the voltage $V_{503}$ when the voltage $V_{505}$ is equal to or greater than the voltage $V_{503}$ plus the threshold voltage $V_{t553}$ (i.e., $V_{505} \geq V_{503} + V_{t553}$).

For one embodiment, the duration T4 must be long enough for the transistor 552 to charge the capacitor 555 to the voltage at the node 504, $V_{504}$, minus the threshold voltage of the transistor 552, $V_{t552}$, when the voltage $V_{504}$ is less than the voltage $V_{503}$ plus the threshold voltage $V_{t552}$ (i.e., $V_{504} < V_{503} + V_{t552}$). Furthermore, during the steady state, the duration T4 must be long enough for the transistor 552 to charge the capacitor 555 to the voltage $V_{503}$ when the voltage $V_{504}$ is greater than or equal to the voltage $V_{503}$ plus the threshold voltage $V_{t552}$ (i.e., $V_{504} \geq V_{503} + V_{t552}$). The non-overlapping relationship between the clock 3 signal and the clock 4 signal is typically required for the bootstrapping circuit to augment the voltage passed across the output diode 550.

As long as the clock 2 signal, the clock 3 signal, and the clock 4 signal have the relationship defined by the periods T1, T2, T3, T4, T5, and T6 and these periods are greater than 0 seconds, then the positive charge pump 500 may output the voltage signal generated by the last stage in the positive charge pump 500. The output diode 550 may be referred to as a zero voltage drop switch 550 because it may pass substantially all the voltage at its input while operating in its steady state condition. After the zero voltage drop switch 550 reaches its steady state, the voltage at its input 503 is substantially equivalent the to the voltage at its output 502. In other words, the voltage drop across the zero voltage drop switch 550 is substantially removed.

For one embodiment, the voltage $V_{reg}$ (i.e., the amplitude of the clock 2 signal, the clock 3 signal, and the clock 4 signal) is typically greater than the voltage at the node 503 (i.e., $V_{503}$) by at least the threshold voltage of the n-channel MOS transistors 551, 552, and 553. The threshold voltages of the transistors 551, 552, and 553 may be substantially the same size.

During phase 1 when the clock signal 3 is at a logic high voltage level, the voltage at the node 504 is at ($V_{503} + V_{reg}$). $V_{503}$ represents the voltage at the node 503 which is coupled to the input of the diode 550. Furthermore, during phase 1, the voltage at the node 505 is at $V_{503}$. During this period, the transistors 553 and 551 are off, and the transistor 552 is on. During phase 2, when the clock signal 3 is at a logic low voltage level, the voltage at the node 505 is at ($V_{503} + V_{reg}$) and the voltage at the node 504 is at $V_{503}$. During this period, the transistors 551 and 553 are on, and the transistor 552 is off. The clock 3 signal and the clock 4 signal are typically non-overlapping high signals to ensure that the transistors 552 and 553 are not on at the same time.

Figure 8:
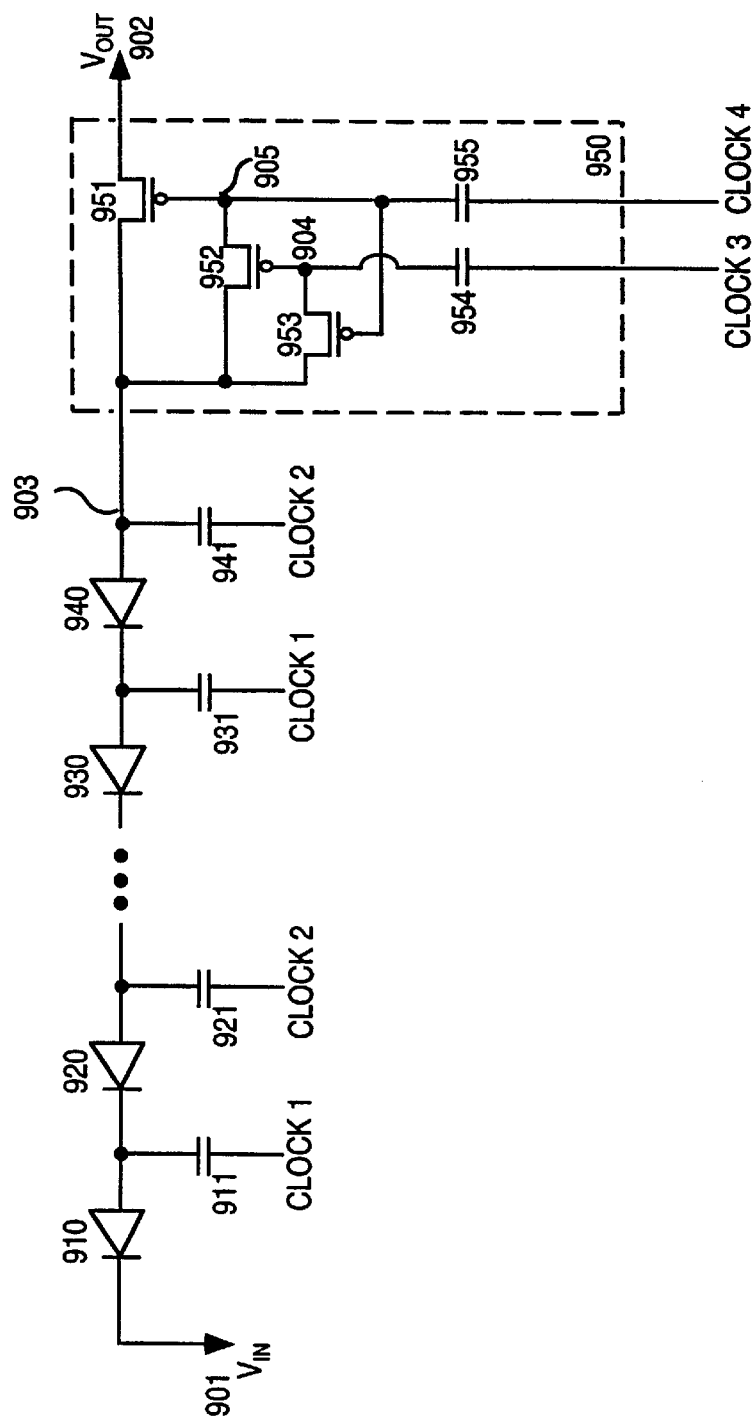
FIG. 8 illustrates one embodiment of a negative charge pump.

For one embodiment, the charge pump 440 may be implemented with the circuit shown in FIG. 8. FIG. 8 illustrates a negative charge pump 900. The input 901 of the charge pump may be coupled to ground and the output 902 of the charge pump provides a negative output voltage signal $V_{out}$.

The negative charge pump 900 may include multiple stages with each stage having a diode coupled to a capacitor. The first stage may include the diode 910 and the capacitor 911; the second stage may include the diode 920 and the capacitor 921; the last stage may include the diode 940 and the capacitor 941; and the second to the last stage may include the diode 930 and the capacitor 931. The capacitors 911 and 931 are coupled to the clock 1 signal and the capacitors 921 and 941 are coupled to the clock 2 signal.

Unlike the output diode in prior art negative charge pump 200, the voltage drop across the output diode 950 may be substantially or fully removed. The output diode 950 may include a switch circuit 950 coupled to a bootstrapping circuit. The bootstrapping circuit is typically used to augment the voltage passed from the input 903 of the output diode 950 to the output 902 of the output diode 950. For one embodiment, the bootstrapping circuit may include the switch devices 952 and 953, and the capacitor devices 954 and 955. According to FIG. 9, the switching devices 951, 952, and 953 may be p-channel MOS transistors. The bootstrapping circuit receives a pair of non-overlapping input clock signals clock 3 and clock 4. For one embodiment, the clock signals clock 3 and clock 4 are non-overlapping low clock signals (i.e., do not have overlapping logic low voltage levels).

The clock signals 3 and 4 may be generated by the clock generator and oscillator circuit 710 shown in FIG. 7. The two output signals out1 and out2 generated by the clock generator and oscillator circuit 710 may be received by the clock driver circuit.

Figure 2:
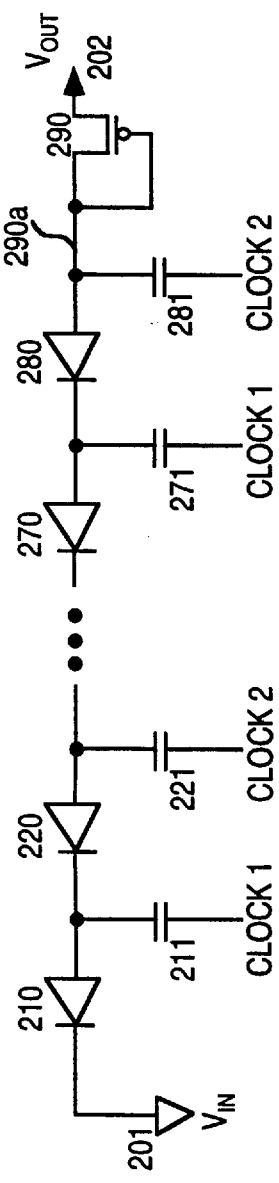
FIG. 2 illustrates a typical negative charge pump.

Referring back to FIG. 2, the voltage drop of the output diode 290 may be approximately 2.0 volts. For one embodiment, during an erase operation, the flash memory cells may require −11 volts for programming. Thus, the prior art negative charge pump 200 may be required to reduce the input voltage $V_{in}$ (i.e., 0 volts) to −13 volts in order to compensate for the 2.0 volt voltage drop $V_t$ across the output diode 290. On the other hand, one embodiment of the negative charge pump 900 may be required to reduce the $V_t$ across the output diode 950 to approximately 0 volts and therefore, one embodiment of the negative charge pump 900 may only be required to reduce $V_{in}$ to −11 volts.

In other words, the prior art negative charge pump 100 may be required to reduce the voltage at $V_{in}$ by −13 volts, as compared to one embodiment of the negative charge pump 900 which may be required to reduce the voltage at $V_{in}$ by −11 volts to get the same output voltage $V_{out}$ (i.e., −11 volts). By decreasing the amount of negative charge that needs to be discharged from the input voltage $V_{in}$ to produce an output voltage $V_{out}$ having the same voltage level, the negative charge pump 900 may operate more efficiently than the prior art charge pump 200. For an alternative embodiment, the diodes 910, 920, 930, and 940 may include a switch circuit coupled to a bootstrapping circuit.

Figure 9:
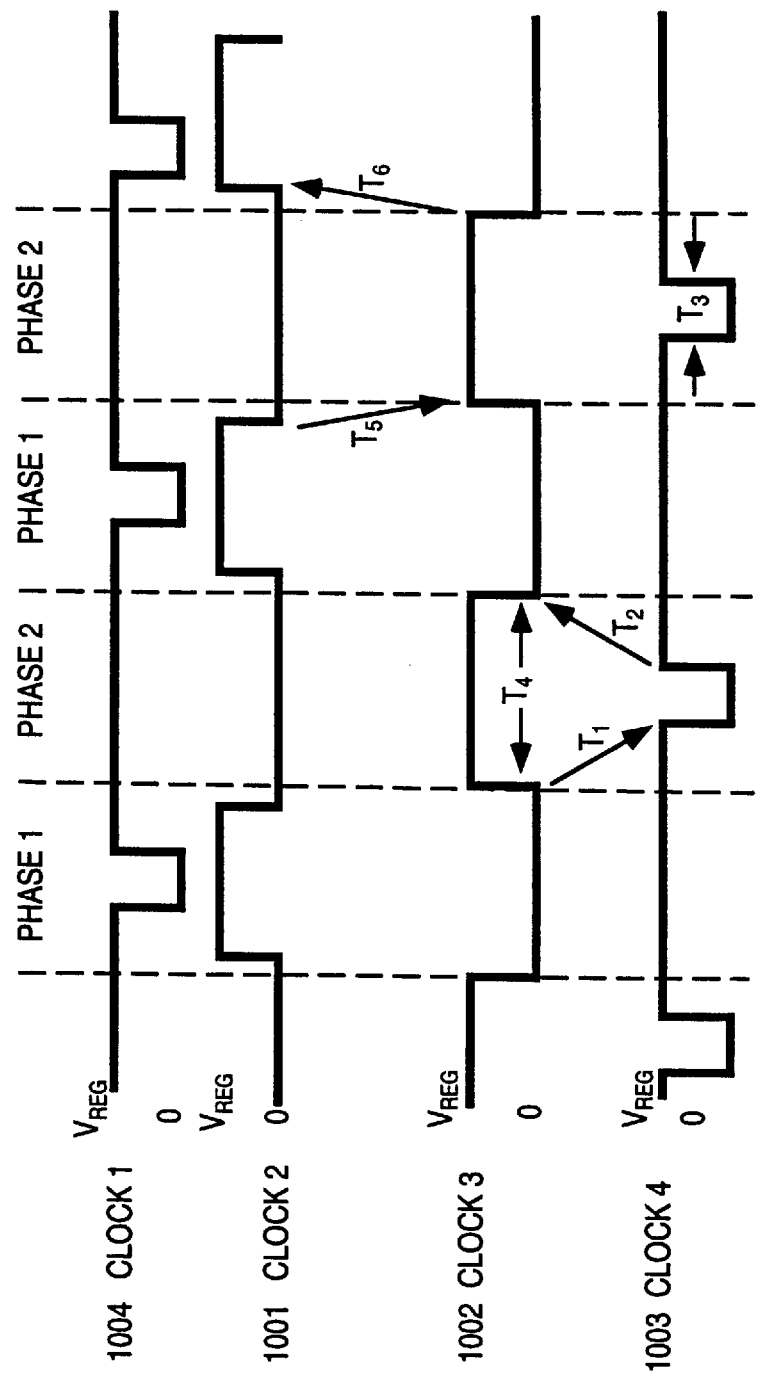
FIG. 9 illustrates the clocking waveforms for one embodiment of a negative charge pump.

For one embodiment, the relationship between the clock 2 signal and the non-overlapping clock signals clock 3 and clock 4 are illustrated in FIG. 9. According to FIG. 9, the waveform 1004 may represent the input clock signal clock 1; the waveform 1001 may represent the input clock signal clock 2; the wave form 1002 may represent the non-overlapping low input clock 3 signal; and the waveform 1003 may represent the non-overlapping low input clock 4 signal. For one embodiment, the logic low voltage level of the clock 1, clock 2, clock 3, and clock 4 signals are referred to as 0 volts and the logic high voltage level of the clock 1, clock 2, clock 3, and clock 4 signals are referred to as $V_{reg}$.

According to FIG. 9, phase 1 may occur when the clock 3 signal is at a logic low voltage level and phase 2 may occur when the clock 3 signal is at a logic high voltage level. The relationship between the clock 3 signal and the clock 4 signal may be characterized as follows. During phase 2, the clock 3 signal transitions to the logic high voltage level a duration of T1 before the clock 4 signal transitions to the logic low voltage level. Furthermore, during phase 2, the clock 4 signal transitions to the logic high voltage level a duration T2 before the clock 3 signal transitions to the logic low voltage level. Typically, the durations T1 and T2 are equal and are greater than 0 seconds. For one embodiment, the duration T1 and T2 must be long enough to turn off the transistors 951 and 953 before the transistor 952 is turned on. Furthermore, T1 and T2 must be long enough to turn off the transistor 952 before the transistors 951 and 953 are turned on. This relationship may prevent back conduction which may degrade the operation of the output diode 950.

The relationship between the clock 2 signal and the clock 3 signal may be characterized by the durations T5 and T6. The clock 2 signal transitions to the logic low voltage level a duration of T5 before the clock 3 signal transitions to the logic high voltage level. Furthermore, the clock 4 signal transitions to the logic low voltage level a duration T6 before the clock 2 signal transitions to the logic high voltage level. Typically, the durations T5 and T6 are equal and are greater than 0 seconds. For one embodiment, the duration T5 and T6 must be long enough for the transistor 952 to charge the capacitor 955 to the voltage at the node 905, $V_{905}$, minus the threshold voltage of the transistor 952, $V_{t952}$, when the voltage $V_{905}$ is greater than the voltage at the node 903, $V_{903}$, minus the threshold voltage $V_{t952}$ (i.e., $V_{905}>V_{903}-V_{t952}$). Furthermore, the duration T5 and T6 must be long enough for the transistor 952 to charge the capacitor 955 to the voltage $V_{903}$ when the voltage $V_{905}$ is less than or equal to the voltage $V_{903}$ minus the threshold voltage $V_{t952}$ (i.e., $V_{905} \leq V_{903}-V_{t952}$).

As mentioned above, for one embodiment, the clock 3 and clock 4 signals are non-overlapping low clock signals. In other words, the clock 3 signal and the clock 4 signal are not simultaneously at the logic low voltage level. According to FIG. 9, the clock signal 3 has a logic high voltage level for a duration T4 and the clock 4 signal has a logic low voltage level for a duration T3. For one embodiment, the duration T3 must be long enough for the transistor 953 to charge the capacitor 954 to the voltage at the node 905, $V_{905}$, minus the threshold voltage of the transistor 953 when the voltage $V_{905}$ is greater than the voltage $V_{905}$ minus the threshold voltage $V_{t953}$ (i.e., $V_{905}>V_{903}-V_{t953}$). Furthermore, during the steady state, the duration T3 must be long enough for the transistor 953 to charge the capacitor 954 to the voltage $V_{903}$ when the voltage $V_{905}$ is less than or equal to the voltage $V_{903}$ minus the threshold voltage $V_{t952}$ (i.e., $V_{905} \leq V_{903}-V_{t953}$).

For one embodiment, the duration T4 must be long enough for the transistor 952 to charge the capacitor 955 to the voltage at the 904, $V_{904}$, minus the threshold voltage of the transistor 952 when the voltage $V_{904}$ is greater than the voltage $V_{903}$ minus the threshold voltage $V_{t952}$ (i.e., $V_{904}>V_{903}-V_{t952}$). Furthermore, during the steady state, the duration T4 must be long enough for the transistor 952 to charge the capacitor 955 to the voltage $V_{903}$ when the voltage $V_{904}$ is less than or equal to the voltage $V_{903}$ minus the threshold voltage $V_{t952}$ (i.e., $V_{904} \leq V_{903}-V_{t952}$). The non-overlapping relationship between the clock 3 signal and the clock 4 signal is typically required for the bootstrapping circuit to augment the voltage passed across the output diode 950.

As long as the clock 2 signal, the clock 3 signal, and the clock 4 signal have the relationship defined by the periods T1, T2, T3, T4, T5, and T6 and these periods are greater than 0 seconds, then the negative charge pump 900 outputs substantially all the voltage provided by the last stage in the negative charge pump 900.

The output diode 950 may be referred to as a zero voltage drop switch 950 because it may pass substantially all the voltage at its input while operating in its steady state condition. After the zero voltage drop switch 950 reaches its steady state, the voltage at its input 903 may be substantially equivalent the to the voltage at its output 902. In other words, the voltage drop across the zero voltage drop switch 950 may be substantially removed.

For one embodiment, the absolute value of voltage $V_{reg}$ (i.e., the amplitude of the clock 2 signal, clock 3 signal, and the clock 4 signal) is greater than the absolute value of the threshold voltages of the p-channel MOS transistors 951, 952, and 953. The threshold voltages of the transistors 951, 952, and 953 may be substantially the same size.

Figure 10:
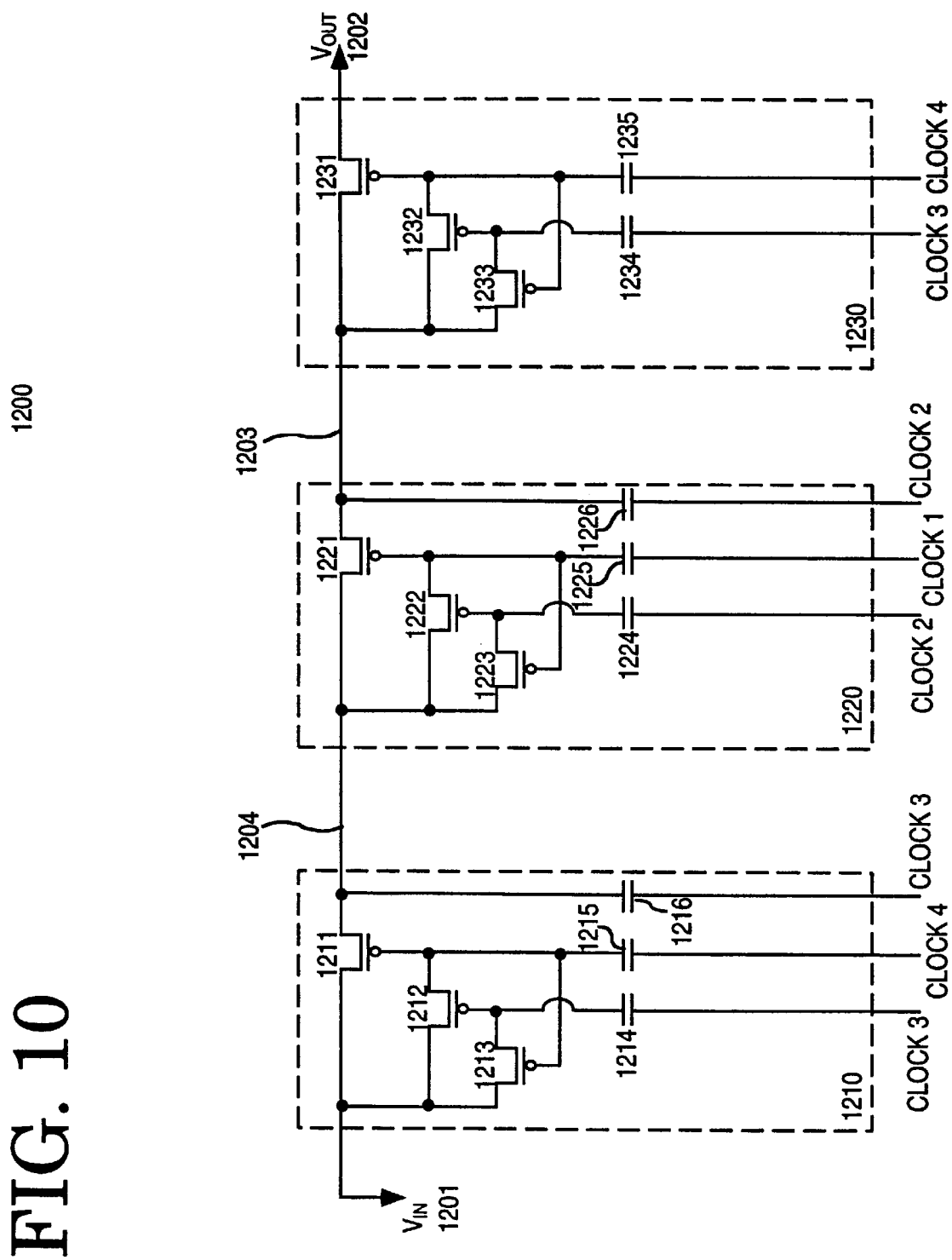
FIG. 10 illustrates an alternative embodiment of a negative charge pump.

FIG. 10 illustrates an alternative embodiment of the negative charge pump. The negative charge pump 1200 may include two stages 1210 and 1220, and an output diode 1230. The first stage 1210 is coupled to the input 1201 of the negative charge pump 1200, which may be coupled to ground. The first stage 1210 may be coupled to the second stage 1220 at the node 1204 and the second stage 1220 may be coupled to the output diode 1230 at the node 1203.

The first stage 1210 may include the capacitor 1216 coupled to a diode, which may include a switch device 1211 and a bootstrapping circuit. The bootstrapping circuit may be used to control the control terminal of the switch device 1211. The bootstrapping circuit in the first stage 1210 may include the switch devices 1212 and 1213, and the capacitors 1214 and 1215. The capacitors 1214 and 1216 may be coupled to the clock 3 signal and the capacitor 1215 may be coupled to the clock 4 signal. The clock 3 signal and the clock 4 signal may have the relationship defined in FIG. 9. The clock 3 signal and the clock 4 signal may be non-overlapping low clock signals.

The second stage 1220 may include the capacitor 1226 coupled to a diode, which may include a switch device 1221 and a bootstrapping circuit. The bootstrapping circuit may be used to control the control terminal of the switch device 1221. The bootstrapping circuit in the second stage 1220 may include the switch devices 1222 and 1223, and the capacitors 1224 and 1225. The capacitors 1224 and 1225 may be coupled to the clock 2 signal and the capacitor 1225 may be coupled to the clock 1 signal. The clock 1 signal and the clock 2 signal may have the relationship defined in FIG. 9. The clock 1 signal and the clock 2 signal may be non-overlapping low clock signals. For another embodiment, the first stage 1210 and the second stage 1220 may be repeated.

The output diode 1230 may include the switch device 1231 and a bootstrapping circuit. The bootstrapping circuit may be used to control the control terminal of the switch device 1231. The bootstrapping circuit in the output diode 1230 may include the switch devices 1232 and 1233, and the capacitors 1234 and 1235. The relationship between the clock 2 signal, the clock 3 signal, and the clock 4 signal was described above in conjunction with FIG. 9.

The negative charge pump 1200 may be referred to as a triple bootstrapping negative charge pump because it includes three bootstrapping circuits. For an alternative embodiment, the triple bootstrapping charge pump may be a positive charge pump. The first bootstrapping circuit may be used to augment the voltage across the diode in the first stage 1210. The second bootstrapping circuit may be used to augment the voltage across the diode in the second stage 1220. The third bootstrapping circuit may be used to augment the voltage across the output diode 1230. By removing the voltage drop across the diode in the first stage 1210, the voltage drop across the diode in the second stage 1220, and the voltage drop across the output diode 1230, the negative charge pump 1200 may operate more efficiently to provide the desired negative voltage level.

By eliminating the voltage drop across the output diode in either a negative charge pump or a positive charge pump, the efficiency of the charge pump may be improved. In other words, a charge pump that eliminates the voltage drop $V_t$ across its output diode may run at a lower frequency than the same charge pump that does not eliminate the voltage drop $V_t$ across its output diode when providing an output voltage signal having the same voltage level. By reducing the frequency of the charge pump (i.e., by providing clock input signals that run at a lower frequency), the charge pump may consume less power. Furthermore, the positive charge pump may be able to output a larger positive output voltage and the negative charge pump may be able to output a more negative output voltage if the voltage drop $V_t$ across the output diode is removed.

In the foregoing specification, the invention has been described with reference to specific embodiments thereof. It will, however, be evident that various modifications and changes may be made thereto without departing from the broader spirit and scope of the invention the specification and drawings are, accordingly, to be regarded in an illustrative rather than a restrictive sense.

What is claimed is:

1. A charge pump circuit, comprising:

a first stage configured to receive a first clock signal;

a second stage coupled to said first stage, said second stage configured to receive a second clock signal; and an output diode coupled to said second stage, said output diode including a first switch circuit coupled to a first bootstrapping circuit, said first bootstrapping circuit configured to receive a first and a second non-overlapping clock signal.

2. The charge pump circuit of claim 1, wherein said charge pump further comprises a first intermediate stage and a second intermediate stage, said first intermediate stage is coupled between said first stage and said second intermediate stage, said first intermediate stage is configured to receive said second clock signal, said second intermediate stage is coupled between said first intermediate stage and said second stage, said second intermediate stage is configured to receive said first clock signal.

3. The charge pump of claim 1, wherein said first switch circuit includes a first terminal coupled to an input of said output diode, a second terminal coupled to an output of said output diode, and a control terminal.

4. The charge pump of claim 3, wherein said bootstrapping circuit is coupled between said first terminal of said first switch circuit and said control terminal of said first switch circuit, said bootstrapping circuit further comprises:

a first capacitive device configured to receive said first non-overlapping clock signal;

a second capacitive device configured to receive said second non-overlapping clock signal;

a second switch circuit having a first terminal coupled to said first terminal of said first switch circuit, a second terminal coupled to said control terminal of said first switch circuit, and a control terminal coupled to said first capacitive device; and a third switch circuit having a first terminal coupled to said first terminal of said first switch circuit, a second terminal coupled to said control terminal of said second switch circuit, and a control terminal coupled to said second capacitive device.

5. The charge pump of claim 4, wherein said first switch circuit, said second switch circuit, and said third switch circuits are n-channel MOS transistors.

6. The charge pump of claim 5, wherein said first switch circuit is larger in size than said second switch circuit and said third switch circuit.

7. The charge pump of claim 4, wherein said first switch circuit, said second switch circuit, and said third switch circuit are p-channel MOS transistors.

8. The charge pump of claim 7, wherein said first switch circuit is larger in size than said second switch circuit and said third switch circuit.

9. The charge pump of claim 1, wherein said first and said second non-overlapping clock signals do not have logic high voltage signals at the same time.

10. The charge pump of claim 9, wherein said first non-overlapping clock signal transitions to a logic low voltage level a first duration before said second non-overlapping clock signal transitions to a logic high voltage level, and said second non-overlapping clock signal transitions to said logic low voltage level a second duration before said first non-overlapping clock signal transitions to said logic high voltage level, said first duration and said second duration are greater than 0 seconds.

11. The charge pump of claim 10, wherein said second clock signal transitions to a logic high voltage level a third duration before said first non-overlapping clock signal transitions to logic low voltage level, and said first non-overlapping clock signal transitions to said logic high voltage level a fourth duration before said second clock signal transitions to said logic low voltage level, said third duration and said fourth duration are greater than 0 volts.

12. The charge pump of claim 1, wherein said first and said second non-overlapping clock signals do not have logic low voltage signals at the same time.

13. The charge pump of claim 12, wherein said first non-overlapping clock signal transitions to a logic high voltage level a first duration before said second non-overlapping clock signal transitions to a logic low clock signal, and said second non-overlapping clock signal transitions to said logic high voltage level a second duration before said first non-overlapping clock signal transitions to said logic low voltage level, said first duration and said second duration are greater than 0 seconds.

14. The charge pump of claim 13, wherein said second clock signal transitions to said logic low voltage level a third duration before said first non-overlapping clock signal transitions to said logic high voltage level, and said first non-overlapping clock signal transitions to said logic low voltage level a fourth duration before said second clock signal transitions to said logic high voltage level, said third and said fourth durations are greater than 0 seconds.

15. The charge pump of claim 1, wherein said first stage includes a first capacitive device and a first diode, said first capacitive device receives said first non-overlapping clock signal, said first diode includes a second switch circuit coupled to a second bootstrapping circuit, said second bootstrapping circuit is configured to receive said first and said second non-overlapping clock signals.

16. The charge pump of claim 15, wherein said second stage includes a second capacitive device and a second diode, said second capacitive device receives said second clock signal, said second diode includes a third switch circuit coupled to a third bootstrapping circuit, said third bootstrapping circuit is configured to receive said first and said second clock signals.

17. The charge pump of claim 16, wherein said first switch circuit in said output diode includes a first terminal coupled to an input of said output diode, a second terminal coupled to a n output of said output diode, and a control terminal, and wherein said first bootstrapping circuit is coupled between said first terminal of said first switch circuit and said control terminal of said first switch circuit, and wherein said second switch circuit in said first diode includes a first terminal coupled to an input of said first diode, a second terminal coupled to an output of said first diode, and a control terminal, and wherein said second bootstrapping circuit is coupled between said first terminal of said second switch circuit and said control terminal of said second switch circuit , and wherein said third switch circuit in said second diode includes a first terminal coupled to an input of said second diode, a second terminal coupled to an output of said second diode, and a control terminal, and wherein said third bootstrapping circuit is coupled between said first terminal of said third switch circuit and said control terminal of said third switch circuit.

18. The charge pump of claim 17, wherein said first bootstrapping circuit comprises:
    a third capacitive device configured to receive said first non-overlapping clock signal;
    a fourth capacitive device configured to receive said second non-overlapping clock signal;
    a fourth switch circuit having a first terminal coupled to said first terminal of said first switch device, a second terminal coupled to said control terminal of said first switch circuit, and a control terminal coupled to said third capacitive device; and
    a fifth switch circuit having a first terminal coupled to said first terminal of said first switch circuit, a second terminal coupled to said control terminal of said fourth switch circuit, and a control terminal coupled to said fourth capacitive device.

19. The charge pump of claim 18, wherein said second bootstrapping circuit comprises:
    a fifth capacitive device configured to receive said second clock signal;
    a sixth capacitive device configured to receive said first clock signal;
    a sixth switch circuit having a first terminal coupled to said first terminal of said second switch device, a second terminal coupled to said control terminal of said second switch circuit, and a control terminal coupled to said fifth capacitive device; and a seventh switch circuit having a first terminal coupled to said first terminal of said second switch circuit, a second terminal coupled to said control terminal of said sixth switch circuit, and a control terminal coupled to said sixth capacitive device.

20. The charge pump of claim 19, wherein said third bootstrapping circuit comprises:
    a seventh capacitive device configured to receive said first non-overlapping clock signal;
    a eighth capacitive device configured to receive said second non-overlapping clock signal;
    a eighth switch circuit having a first terminal coupled to said first terminal of said third switch device, a second terminal coupled to said control terminal of said third switch circuit, and a control terminal coupled to said seventh capacitive device; and
    a ninth switch circuit having a first terminal coupled to said first terminal of said third switch circuit, a second terminal coupled to said control terminal of said eighth switch circuit, and a control terminal coupled to said eighth capacitive device.

21. A method of substantially removing the voltage drop across an output diode in a charge pump comprising the steps of:
    (a) providing a power supply voltage signal having a first voltage level;
    (b) charging said power supply voltage signal to a second voltage level in response to a first clock signal;
    (c) charging said power supply voltage signal to a third voltage level in response to a second clock signal;
    (d) outputting from said charge pump said power supply voltage signal having said third voltage level in response to said second clock signal, a first non-overlapping clock signal, and a second non-overlapping clock signal.

22. The method of claim 21, wherein said first voltage level, said second voltage level, and said third voltage level are at the same voltage level.

23. The method of claim 21, wherein step (d) includes the steps of:
    (1) transitioning said first non-overlapping clock signal to a logic low voltage level before said second non-overlapping clock signal transitions to a logic high voltage level;
    (2) transitioning said second non-overlapping clock signal to said logic low voltage level before said first non-overlapping clock signal transitions to said logic high voltage level;
    (3) transitioning said second clock signal to said logic high voltage level before said first non-overlapping clock signal transitions to said logic low voltage level; and
    (4) transitioning said second non-overlapping clock signal to said logic high voltage level before said second clock signal transitions to said logic low voltage level.

24. The method of claim 21, wherein step (d) includes the steps of:
    (1) transitioning said first non-overlapping clock signal to a logic high voltage level before said second non-overlapping clock signal transitions to a logic low voltage level;
    (2) transitioning said second non-overlapping clock signal to said logic high voltage level before said second non-overlapping clock signal transitions to said logic low voltage level;

(3) transitioning said second clock signal to said logic low voltage level before said first non-overlapping clock signal transitions to said logic high voltage level; and (4) transitioning said first non-overlapping clock signal to said logic low voltage level before said second clock signal transitions to said logic high voltage level.

25. A method of substantially removing the voltage drop across an output diode in a charge pump comprising the steps of:

(a) providing a power supply voltage signal having a first voltage level;

(b) discharging said power supply voltage signal to a second voltage level in response to a first clock signal;

(c) discharging said power supply voltage signal to a third voltage level in response to a second clock signal;

(d) outputting from said charge pump said power supply voltage signal having said third voltage level in response to said second clock signal, a first non-overlapping clock signal, and a second non-overlapping clock signal.

* * * * *

UNITED STATES PATENT AND TRADEMARK OFFICE
CERTIFICATE OF CORRECTION

PATENT NO.    : 5,841,703
DATED         : November 24, 1998
INVENTOR(S)   : Wojciechowski It is certified that error appears in the above-identified patent and that said Letters Patent is hereby corrected as shown below:

Column 13,
Line 22, delete "a n" and insert -- an-- .

Signed and Sealed this

Seventeenth Day of June, 2003

JAMES E. ROGAN
*Director of the United States Patent and Trademark Office*